United States Patent [19]

Otajima et al.

[11] 3,772,605

[45] Nov. 13, 1973

[54] FREQUENCY DISCRIMINATOR WITH CERAMIC OSCILLATOR

[75] Inventors: Tomiji Otajima; Koichi Oya, both of Tokyo; Takeo Nasu; Hisatake Okamura, both of Yokohama, all of Japan

[73] Assignee: Taiyo Yuden Kabushiki Kaisha, Tokyo, Japan

[22] Filed: Oct. 20, 1972

[21] Appl. No.: 300,409

[30] Foreign Application Priority Data

Oct. 21, 1971 Japan .............................. 46/83501

[52] U.S. Cl. ................. 329/117, 307/233, 331/158, 331/65

[51] Int. Cl. ............................................ H03d 3/16

[58] Field of Search ....................... 329/117; 332/26; 331/1, 65, 66, 158; 307/233; 325/349

[56] References Cited

UNITED STATES PATENTS

| | | | |
|---|---|---|---|
| 2,712,600 | 7/1955 | Beckwith | 329/117 |
| 2,724,089 | 11/1955 | Ruston | 329/117 X |
| 2,913,580 | 11/1959 | Kosowsky | 329/117 |
| 3,108,230 | 10/1963 | Hurtig | 329/117 |
| 3,418,597 | 12/1968 | Smith | 307/233 X |

*Primary Examiner*—Alfred L. Brody
*Attorney*—Eric H. Waters et al.

[57] ABSTRACT

A frequency discriminator using a ceramic oscillator is provided which is characterized in that a series circuit comprising a coupling condenser and a resistor R1 is connected between input terminals and a series of parallel circuits comprising the ceramic oscillator, resistors, diodes, and a condenser are connected between the junction of the coupling condenser and the first mentioned resistor and one of a pair of output terminals. A condenser is connected between the output terminals.

7 Claims, 10 Drawing Figures

PRIOR ART FIG. 1
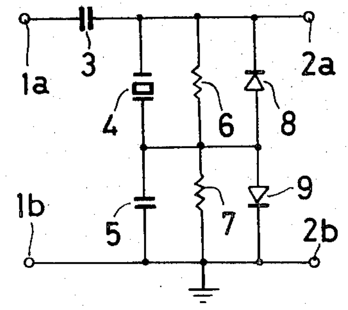
FIG. 2
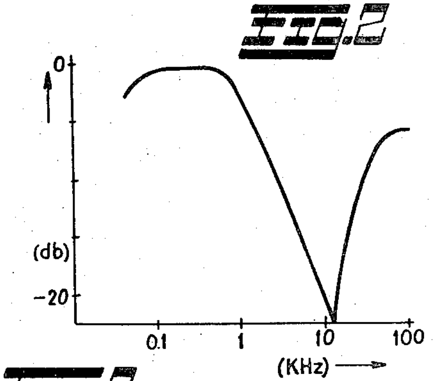
FIG. 3
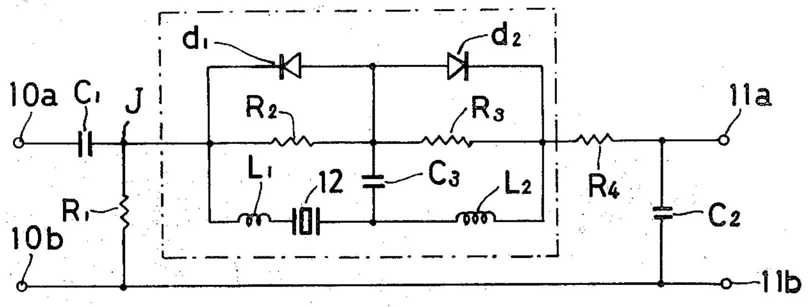
FIG. 4
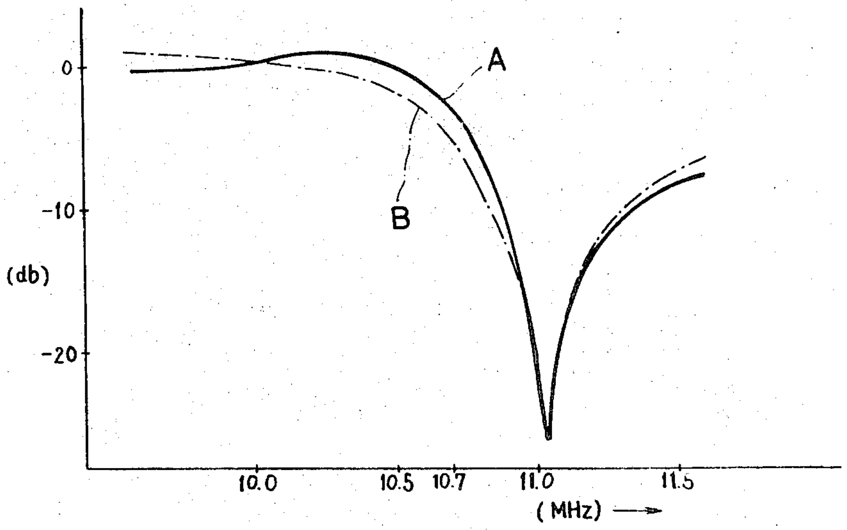

FREQUENCY DISCRIMINATOR WITH CERAMIC OSCILLATOR

FIELD OF THE INVENTION

This invention relates to frequency discriminators and more particularly to frequency discriminators including ceramic oscillators.

BACKGROUND

It is generally known that a frequency discriminator can be constructed with the use of a crystal or ceramic oscillator.

One such frequency discriminator is known which comprises input and output terminals with a capacitor coupling one of the input terminals to one of the output terminals and with said capacitor being connected in series with a further capacitor and a ceramic oscillator between the input terminals. This construction furthermore includes resistors connected in parallel with the ceramic oscillator and with one of the aforementioned capacitors and with diodes connected across the aforesaid resistors and between the aforesaid output terminals.

In the construction described above, the frequency discriminator is defective in that the peak-to-peak width of the S-curve characteristic is narrow and in that the symmetry of the S-curve is poor. Furthermore, the linear range in the S-curve characteristic is narrow and, furthermore, in that range the linear characteristic is poor. Additionally, the detection output level is low and varies with the frequency change of the modulated wave.

Additonally, the modulation frequency versus detection output characteristics is remarkably worsened in the high range so that the frequency discriminator cannot be used, for example, as an FM demodulator in a receiver for a carrier-suppression type AM-FM stereophonic broadcast system.

SUMMARY

It is an object of the invention to provide an improved frequency discriminator of the type which employs a ceramic oscillator.

It is a further object of the invention to provide an improved frequency discriminator which has a flat detection output characteristic over a wide frequency range.

It is another object of the invention to provide an improved frequency discriminator which can be employed for example in a receiver for a carrier-suppression type AM-FM stereophonic broadcast system.

In achieving the above and other of the objects of the invention, there is provided a frequency discriminator comprising input terminals, output terminals, a first capacitor and a first resistor connected via a junction in series between the input terminals, a second capacitor connected between the output terminals and at least two further resistors connected between the junction of said first capacitor and first resistor and one of said output terminals, there being furthermore provided diodes connected in parallel with said further resistors. A first series circuit is provided including a ceramic oscillator and a further capacitor in parallel with one of said further resistors. A second series circuit is also provided including said further capacitor and an impedor in parallel with the other of said further resistors.

In accordance with a feature of the invention, the aforesaid diodes are oppositely polarized.

In accordance with still another feature of the invention a further resistor is provided between said second series circuit mentioned hereinabove and said one output terminal.

According to still a further feature of the invention the first series circuit includes a coil in series with the above-mentioned oscillator.

According to yet another feature of the invention the aforesaid impedor is a coil.

In further accordance with the invention there may be provided a circuit comprising the above described frequency discriminator and, in series therewith, an amplifier and a transformer.

According to another aspect of the invention a circuit of the above-noted type may be provided in which the transformer is replaced by a ceramic filter.

The above and further objects and features of the invention will be found in the detailed description which follows hereinbelow and as illustrated in the accompanying drawing.

BRIEF DESCRIPTION OF THE DRAWING

FIG. 1 is a schematic diagram showing an example of a conventional known type of a frequency discriminator with a ceramic oscillator;

FIG. 2 is a chart showing the modulation frequency versus detection output characteristics of the frequency discriminator shown in FIG. 1;

FIG. 3 is a schematic circuit diagram of a frequency discriminator with a ceramic oscillator in accordance with this invention;

FIG. 4 is a frequency response characteristic chart of the ceramic oscillator as used in the circuit of FIG. 3.

DETAILED DESCRIPTION

Figure 5:
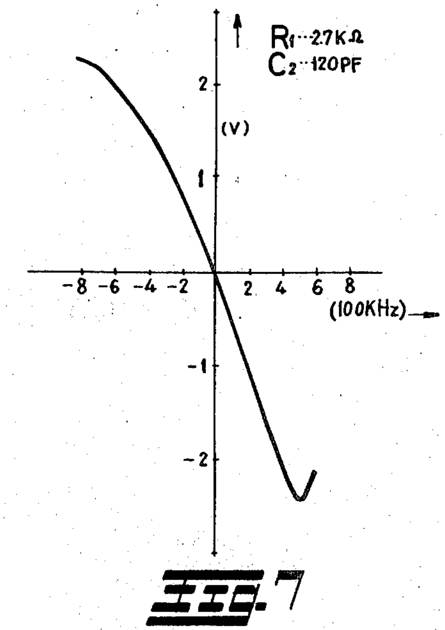
FIGS. 5 to 8 are charts showing discrimination characteristics of the frequency discriminator arrangement shown in FIG. 3.

It is known that by using a crystal or ceramic oscillator, a frequency discriminator of the construction shown in FIG. 1 can be formed.

In FIG. 1, elements 1*a* and 1*b* are input terminals, elements 2*a* and 2*b* are output terminals, element 3 is a coupling condenser, element 4 is a ceramic oscillator, element 5 is a condenser, elements 6 and 7 are resistors and elements 8 and 9 are diodes.

The frequency discriminator shown in FIG. 1 operates such that, according to the discrimination characteristic obtained by the circuit arrangement formed between the input terminals 1*a* and 1*b* and the output terminals 2*a* and 2*b*, a frequency modulated wave applied to the input terminals 1*a* and 1*b* can be demodulated to obtain a demodulated output from the output terminals 2*a* and 2*b*.

However, the frequency discriminator of the construction shown in FIG. 1 is defective in that not only is the peak-to-peak width of the S-curve characteristic narrow and, in addition, the symmetry of the S-curve poor, but also the linear range in the S-curve characteristic is narrow and, furthermore, in that range, is poor. Additionally, the detection output level is low and varies with the frequency change of the modulated wave.

FIG. 2 shows a curve of the relationship between modulation frequency and detection output in the frequency discriminator of FIG. 1. The abscissa shows modulation frequency and the ordinate shows the detection output.

The frequency discriminator of FIG. 1 is such that modulation frequency versus detection output characteristic is remarkably worsened at the high range so that the same cannot be used, for example, as an FM demodulator in a receiver set for a carrier-suppression type AM-FM stereophonic broadcast system (FM stereophonic receiver set).

The present invention provides a frequency discriminator using a ceramic oscillator that has a characteristic of modulation frequency versus detection output which is flat over a wide frequency range so as to be usable even in a receiver set for a carrier-suppression type AM-FM stereophonic broadcast system. This will now be explained in detail with reference to FIG. 3 which is a circuit diagram of a frequency discriminator with a ceramic oscillator according to this invention.

In FIG. 3 elements 10*a* and 10*b* are input terminals and elements 11*a* and 11*b* are output terminals. A series circuit comprising a coupling condenser C1 and a resistance R1 is connected between the input terminals 10*a* and 10*b*.

A condenser C2 is connected between output terminals 11*a* and 11*b*.

Between the junction J of the condenser C1 and the resistance R1 and the output terminal 11*a*, resistors R2, R3 and R4 are connected in series. Additionally, resistor R2 is provided with a diode *d*1 connected in parallel therewith and also with a series circuit comprising a coil L1, a ceramic oscillator 12 and a condenser C3 that is connected in parallel with resistor R2. The resistor R3 is provided with a diode *d*2 connected in parallel therewith and also with a series circuit comprising an impedor or coil L2 and the condenser C3, which series circuit is connected in parallel therewith. Diodes *d*1 and *d*2 are oppositely polarized.

The foregoing coil L1 is a coil used for widening the frequency gap between the resonance frequency and the anti-resonance frequency. Therefore, the use of the coil L1 is not required if the ceramic oscillator 12 has the desired frequency gap between the resonance frequency and the anti-resonance frequency. The resistor R4 is interposed for adjusting the output level of the frequency discriminator. The coil L2 is used for improving the symmetry characteristic of the S-curve.

In the circuit arrangement shown in FIG. 3, a condenser having a suitable electrostatic capacity can be used instead of the coil L2.

FIG. 4 is a chart showing an example of the characteristic of the ceramic oscillator 12 used in the circuit arrangement of FIG. 3. Curve A in FIG. 4 shows the frequency response characteristic of the ceramic oscillator itself and curve B shows the frequency response characteristic in the case where a coil L1 of 2μ H is connected in series with the ceramic oscillator 12.

FIG. 5 shows a discrimination characteristic curve obtained with the circuit arrangement of FIG. 3 in the case where a ceramic oscillator 12 having the frequency response characteristic of curve A in FIG. 4 is used and the condenser C1 is 0.08μF, the resistor R1 is 2.7 K Ω, the resistor R2 is 6.8 Ω, the resistor R3 is 4.7 K Ω, the coil L1 is about 2μH, the coil L2 is about 4μH, the condenser C3 is 100PF, the resistor R4 is of a value within the range of 0 – 50 Ω and the condenser C2 is 120 PF.

Figure 8:
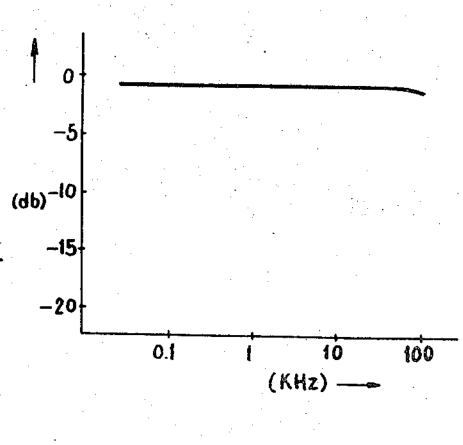

FIG. 8 shows a curve of the modulation frequency versus detection output characteristic obtained by the frequency discriminator of FIG. 3 in the case where the value of the circuit constants in the circuit arrangement of FIG. 3 is selected as indicated above.

Figure 6:
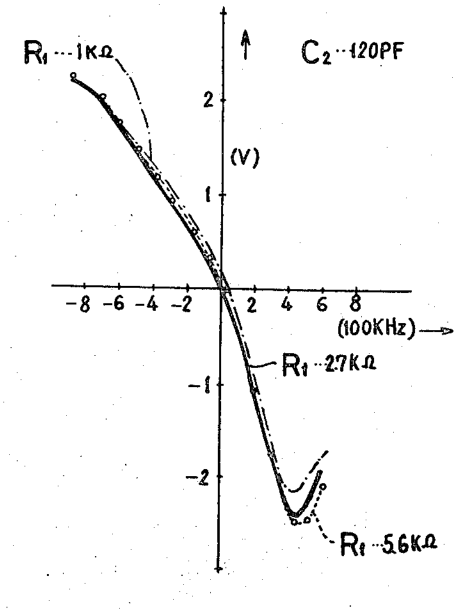

FIG. 6 shows the discrimination characteristic curves obtained when the resistance value of the resistor R1 in the circuit arrangement shown in FIG. 3 is changed to 1KΩ, 2.7KΩ, and 5.6KΩ, respectively.

Figure 7:
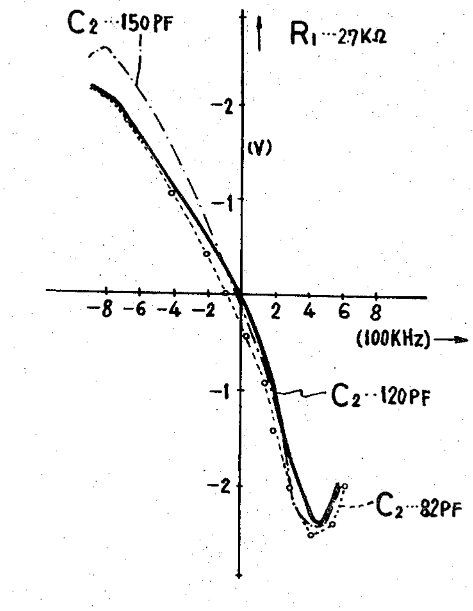

FIG. 7 shows the discrimination characteristic curves obtained when the capacity value of the condenser C2 in the circuit arrangement shown in FIG. 3 is changed to 82 PF, 120 PF and 150 PF, respectively.

As is clear from the changes shown in FIGS. 6 and 7 due to changes of the resistor R1 and of the condenser C2, the discrimination characteristic of the frequency discriminator of the circuit construction shown in FIG. 3 can be remarkably improved as to linear characteristic in the linear range of the discrimination characteristic by proper selection of the values of the resistor R1 and the condenser C2.

The frequency discriminator shown in FIG. 3 has a modulation frequency versus detection output characteristic that is flat over a wide frequency range as shown in FIG. 8, so that this frequency discriminator can be used, for example, even in a receiver for a carrier-suppression type AM-FM stereophonic broadcast system. Thus, the problem of conventional discriminators can be solved by the invention.

Figure 9:
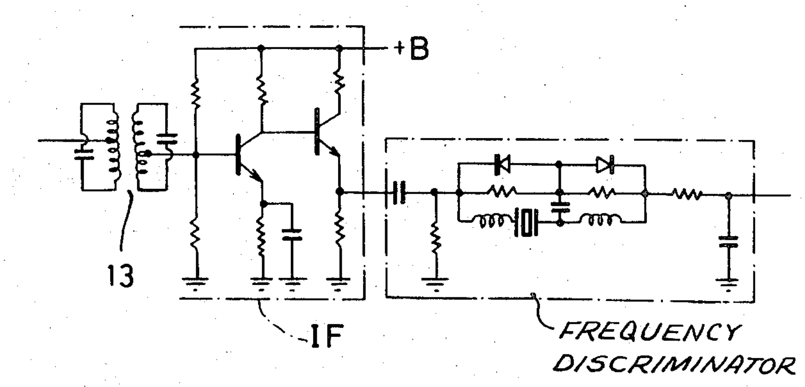
FIGS. 9 and 10 are schematic diagrams showing the manner of use of the frequency discriminator of FIG. 3.
Figure 10:
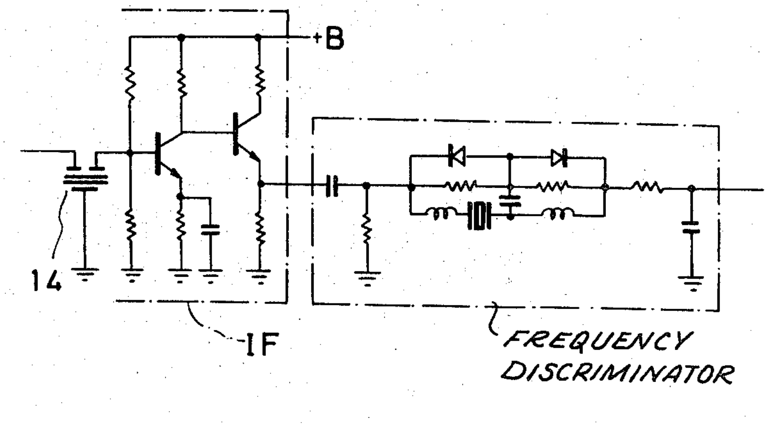

FIGS. 9 and 10 show examples of use of the invention. In FIGS. 9 and 10, component IF is an intermediate frequency amplifier, element 13 is an intermediate frequency transformer and element 14 is a ceramic filter.

This invention solves the problems in conventional circuits with the use of an extremely simple circuit arrangement and can provide, at low cost, excellent characteristics for a frequency discriminator including a detection output characteristic which is flat over a wide frequency range. The circuit of this invention can be effectively utilized even for equipment wherein wide range signals are required to be FM demodulated such as for example, in a receiver for a carrier-suppression type AM-FM stereophonic broadcast system. Thereby, the cost of the incorporating equipment can be extremely lowered.

What is claimed is:

1. A frequency discriminator comprising input terminals, output terminals, a first capacitor and a first resistor connected via a junction in series between the input terminals, a second capacitor connected between the output terminals, at least two further resistors connected between the junction of said first capacitor and first resistor and one of said output terminals, diodes connected in parallel with said further resistors, a first series circuit including a ceramic oscillator and a further capacitor in parallel with one of said further resistors, and a second series circuit including said further capacitor and an impedor in parallel with the other of said further resistors.

2. A discriminator as claimed in claim 1 wherein said diodes are oppositely polarized.

3. A discriminator as claimed in claim 1 comprising a further resistor between said second series circuit and said one output terminal.

4. A discriminator as claimed in claim 1 wherein said first series circuit includes a coil in series with said oscillator.

5. A discriminator as claimed in claim 1 wherein said impedor is a coil.

6. A circuit comprising a frequency discriminator as claimed in claim 1 and, in series therewith, an amplifier and a transformer.

7. A circuit comprising a frequency discriminator as claimed in claim 1 and, in series therewith, an amplifier and a ceramic filter.

* * * * *